(12) United States Patent
Soman et al.

(10) Patent No.: US 6,927,140 B2
(45) Date of Patent: Aug. 9, 2005

(54) METHOD FOR FABRICATING A BIPOLAR TRANSISTOR BASE

(75) Inventors: Ravindra Soman, Portland, OR (US); Anand Murthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/225,586

(22) Filed: Aug. 21, 2002

(65) Prior Publication Data

US 2004/0048439 A1 Mar. 11, 2004

(51) Int. Cl.[7] .......................................... H01L 21/8222
(52) U.S. Cl. ...................... 438/309; 438/350; 438/508
(58) Field of Search .............................. 438/510, 309, 438/312, 478, 503, 508; 118/725

(56) References Cited

U.S. PATENT DOCUMENTS

| | | | |
|---|---|---|---|
| 5,221,556 A | * 6/1993 | Hawkins et al. | ....... 427/255.17 |
| 5,261,960 A | 11/1993 | Ozias | |
| 5,734,183 A | 3/1998 | Morishita | |
| 5,962,880 A | 10/1999 | Oda et al. | |
| 6,093,252 A | 7/2000 | Wengert et al. | |
| 6,107,151 A | 8/2000 | Enquist | |
| 6,143,079 A | 11/2000 | Halpin | |
| 6,342,277 B1 | 1/2002 | Sherman | |
| 2002/0182423 A1 | * 12/2002 | Chu et al. | ................... 428/446 |
| 2003/0190422 A1 | * 10/2003 | Yoo | ........................ 427/248.1 |

OTHER PUBLICATIONS

H.J. Osten, D. Knoll, B. Heinemann, H. Rucker, and B. Tillack, "Carbon Doped SiGe Heterojunction Bipolar Transistors for High Frequency Applications," Institute for Semiconductor Physics (IHP), 1999, pp. 109–116, Walter–Korsing–Str. 2, D–15230 Frankfurt (Oder), Germany.

* cited by examiner

Primary Examiner—Tuan H. Nguyen
(74) Attorney, Agent, or Firm—Blakely, Sokoloff, Taylor & Zafman LLP

(57) ABSTRACT

A method for forming a base of a bipolar transistor. A narrow base is formed using a flash of boron doping gas in a reaction chamber to create a narrow base with high boron concentration. This method allows for reliable formation of a base with high boron concentration while maintaining manageability in controlling deposition of other materials in a substrate.

19 Claims, 8 Drawing Sheets

METHOD FOR FABRICATING A BIPOLAR TRANSISTOR BASE

BACKGROUND

1. Field

Circuit fabrication, including a method for forming a base region of a bipolar transistor.

2. Description of the Related Art

Bipolar transistors, more specifically heterojunction bipolar transistors (HBTs) are used in devices requiring high frequency operation such as wireless and networking devices. HBTs are used in these devices because of their high cut off frequencies greater than 150 gigahertz (Ghz) even though they consume more power than equivalent metal oxide semiconductor (MOS) based technologies.

HBTs typically consist of an emitter region, base region and collector region. The emitter region generally has a larger band gap than the base region to achieve high frequency performance. The speed at which the HBT can switch is referred to as the cutoff frequency, $f_t$. The cutoff frequency of a given HBT is generally related to the width of its base region. The narrower the base region of a HBT, the shorter the base transit time and higher the cutoff frequency, $f_t$.

HBTs formed in silicon germanium (SiGe) films typically use boron diffusion or implantation to form a base region. Methods for forming HBTs include chemical vapor deposition (CVD) techniques. However, current methods for forming HBTs are limited in further reliably decreasing the base width because such methods are generally unable to create adequate boron concentration in a base region with reduced base width while controlling the SiGe deposition rate. Boron tends to diffuse rapidly in a SiGe film using current methods causing thick base widths of greater than 25 nanometers (nm).

BRIEF DESCRIPTION OF THE DRAWINGS

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

DETAILED DESCRIPTION

Exemplary embodiments are described with reference to specific configurations and techniques. Those of ordinary skill in the art will appreciate the various changes and modifications to be made while remaining within the scope of the appended claims. Additionally, well known elements, devices, components, circuits, process steps and the like are not set forth in detail.

Figure 1:
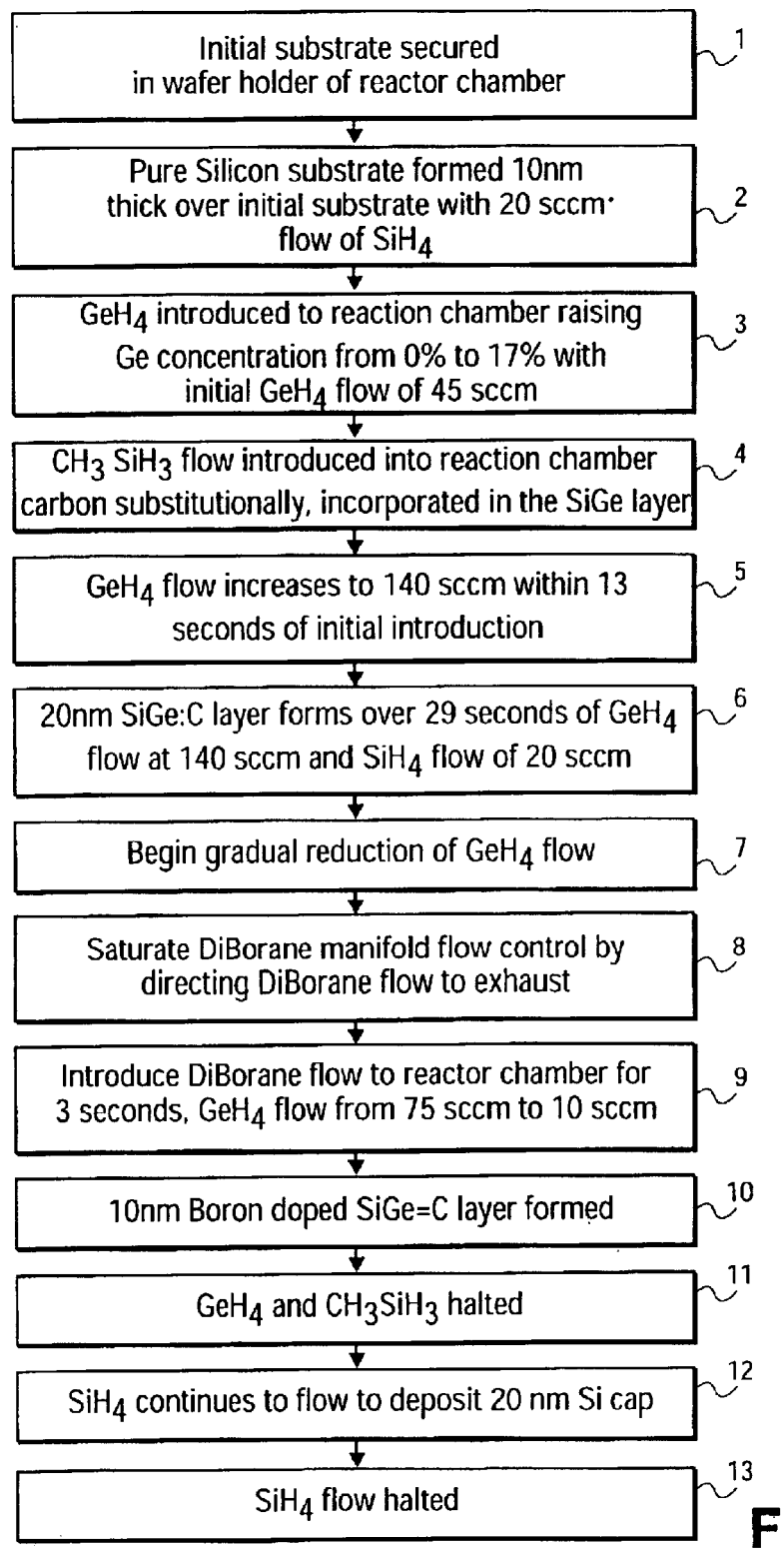
FIG. 1 is a flow chart of a method to fabricate an ultra narrow boron doped SiGe:C base.
Figure 2:
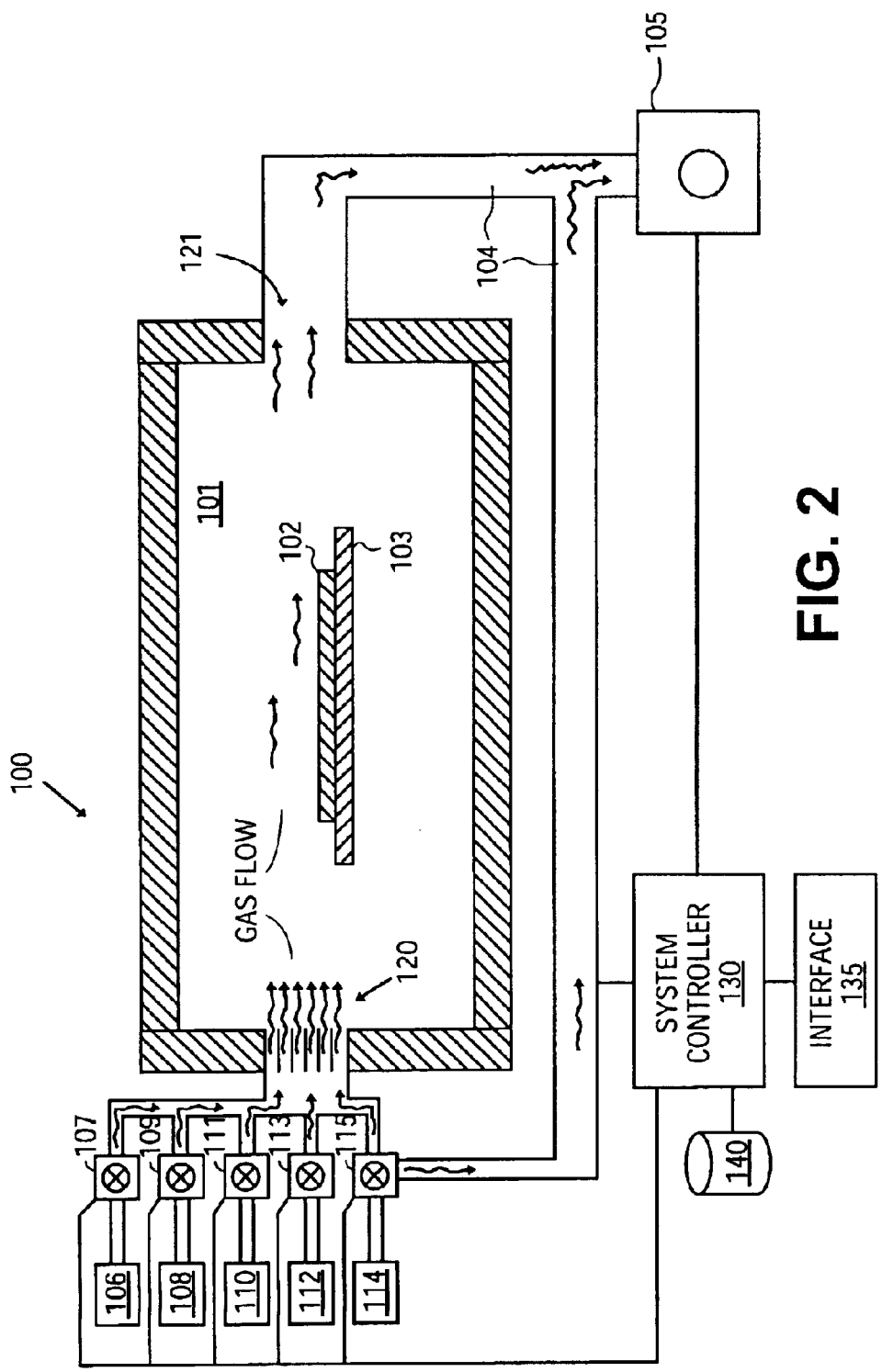
FIG. 2 depicts a substrate within a reactor chamber and a manifold control flow system of the reactor.

FIG. 1 is a flow chart of one embodiment of a method of forming a heterojunction bipolar transistor (HBT). FIG. 2 illustrates a substrate in a chamber undergoing the method described in FIG. 1. FIGS. 7–12 show the formation of an HBT on a substrate according to one method.

Referring to FIG. 1, a wafer or substrate is placed in a reactor (block 1). Referring to FIG. 2, Reactor 100 includes reactor chamber 101. In one embodiment, the chamber is that of an Epsilon® E3000 300 millimeters (mm) Epitaxial Reactor or E2500 or E2000 200 mm Epitaxial Reactor manufactured by ASM, Inc. Within reactor chamber 101 is wafer holder on stage 103 for securing substrate 102 onto which depositions are to be made. Reactor 100 also includes a heat source disposed in reactor chamber 101, such as in wafer holder 103 (e.g., a thermocouple). The temperature within reactor chamber 101 may be monitored by one or more temperature gauges (not shown). Source gases and carrier precursor gases enter the reaction chamber at port 120 and flow through reaction chamber 101 to chamber exhaust port 121. Chamber exhaust 104 is coupled to vacuum 105 which maintains a desired pressure within the chamber. The pressure within reaction chamber 101 may be monitored by one or more pressure gauges (not shown). In one embodiment, the temperature gauges and/or the pressure gauges are coupled to a process controller that regulates the temperature and pressure within reaction chamber 101.

Introduction of gases into the chamber are managed by manifold control valves 107, 109, 111, 113, and 115. Source and carrier gases are generated at source points 106, 108, 110, 112, and 114. In one embodiment, the control valves are coupled to a system controller. In another embodiment, the gases introduced through the control valves are carrier precursor gases. A carrier precursor gas is a gas or energized gas of one or more of ions or radicals of a constituent that upon introduction into a substrate produces carriers such as electrons or holes. Such gases are distinguished from inert carrier gases such as nitrogen ($N_2$) or Hydrogen ($H_2$) that may be used in delivering a carrier precursor gas to reaction chamber 101.

In one embodiment, substrate 102 may be a semiconductor substrate such as a silicon wafer (e.g., a 300 millimeter (mm) diameter silicon wafer). Alternatively, substrate 102 may be a silicon-on-insulator (SOI) substrate such as a single crystal silicon film on an insulator.

In one embodiment, a system controller controls the environmental conditions and process elements in the reactor chamber 101 including manifold control valves 107, 109, 111, 113 and 115 and other process related devices. The system controller, for example, controls reactor chamber 101 temperature, flow rates of source and carrier gases into the reactor chamber 101 and the timing of source gas release into the reactor chamber. In one embodiment, the system controller receives input from a user to set any of the environmental conditions, process steps, or to create a set sequence of changes for the process elements or environmental conditions. In one embodiment, the system controller is coupled to a memory storage device 140 comprising a machine-readable medium having a machine-readable program embodied therein for directing operation of the system. In one embodiment, user input is given to the system controller using a system controller interface 135.

FIGS. 7–12 show the formation of an HBT on substrate 102 according to one representation technique.

Figure 7:
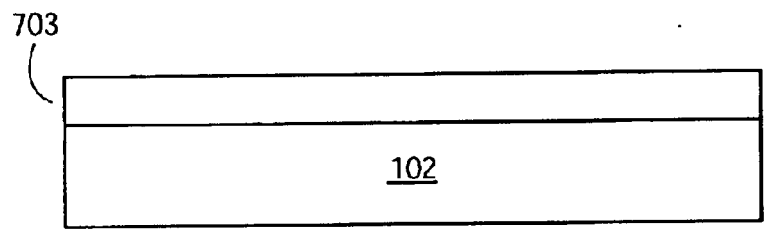
FIG. 7 depicts a cross-sectional side view of a portion of a substrate on which an HBT is to be formed and shows a layer thereon.

FIG. 7 shows a 10 nm layer of single crystal semiconductor 703 formed on the substrate 102 by introducing a 20 standard cubic centimeter per minute (sccm) flow of silicon-based gas through the associated manifold 107 into the reaction chamber 101 from source 106 (FIG. 1, block 2). In one embodiment, the silicon based gas is silane ($SiH_4$). Other silicon based gases such as disilane or dichlorosilane can also be used for this purpose. This thin single crystal silicon layer acts as a seed layer and helps nucleation and growth of the SiGe layer. In one embodiment the $SiH_4$ source is 1% $SiH_4$ in a $SiH_4$ and $H_2$ mixture.

In one embodiment, after the single crystal silicon layer is formed, a germanium based gas is introduced into the reaction chamber 101 (FIG. 1, block 3). In one embodiment, the germanium-based gas is germane ($GeH_4$). Other germanium based gases include dichlorogermane.

One initial flow rate of the germanium based gas $GeH_4$ is 45 sccm. The $GeH_4$ is introduced into reactor chamber 101 through manifold 109 from source 108 (See FIG. 2). In one embodiment, the percentage of $GeH_4$ in the source gas is one percent with the remainder a carrier gas such as hydrogen $H_2$.

Figure 8:
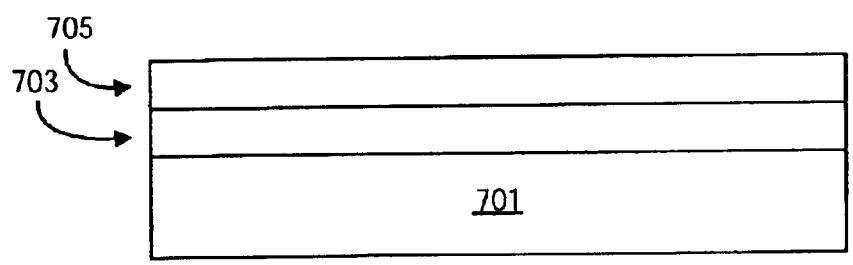
FIG. 8 depicts the substrate of FIG. 7 with a silicon germanium layer formed thereon.

A collector region 705 is formed over the single crystal silicon layer. In one embodiment, the germanium based gas flow is ramped up to 140 sccm within 13 seconds of introduction into reactor chamber 101 (FIG. 1, block 5). In this embodiment, the silicon based gas flow is held constant at 20 sccm during the ramp up period. This mixture of gases in the reaction chamber 101 results in the concentration of germanium in the deposition on the substrate 102 to rapidly grade from zero to 17 percent. This forms silicon germanium (SiGe) layer 705 over the pure silicon layer as illustrated in FIG. 8. In one embodiment, the $GeH_4$ and $SiH_4$ flow through the reaction chamber 101 for 29 seconds at 140 (sccm) and 20 sccm, respectively (FIG. 1, block 6). The layer of SiGe that is formed is 20 nm wide with an overall germanium concentration of 17 percent measured by Secondary Ion Mass Spectrometry (SIMS).

Figure 9:
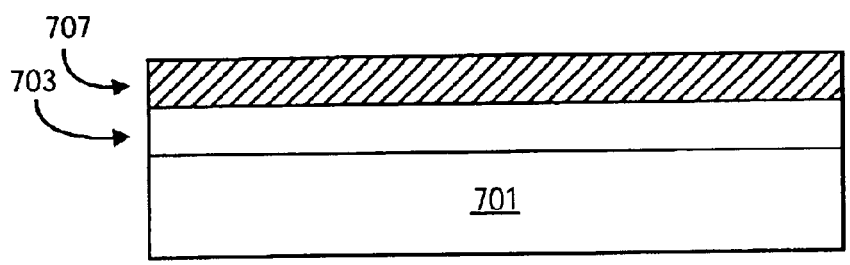
FIG. 9 depicts the substrate of FIG. 8 with carbon substitutionally combined with the silicon germanium layer.

In one embodiment, carbon based gas is introduced into reaction chamber 101 after the germanium based gas is introduced (FIG. 1, block 4). In this embodiment, a carbon based gas such as methyl silane ($CH_3SiH_3$) is introduced into reactor chamber 101 through the associated manifold flow control valve 111 from source 110. FIG. 9 shows carbon substitutionally combines with the forming SiGe layer to create SiGe:C layer 707. The percentage of methyl silane in the source is approximately 2 percent with the remainder a carrier gas such as $H_2$. In another embodiment, carbon-based gas is introduced into the reactor chamber 101 by manifold flow control valve 111 approximately when the germanium-based gas is introduced and continues, in this embodiment, at a constant flow rate of 20 sccm until completion of depositions related to forming the base region are complete. Other possible carbon carrier gases include Methyl Silane ($CH_3SiH_3$).

Carbon substituted in the manner described above into the SiGe lattice serves as a diffusion suppressant for boron. In one embodiment, the SiGe:C layer limits initial diffusion of boron to a narrow base region. Widening of the doped base region during subsequent processing, especially during annealing of the substrate during refinement subsequent to the formation of the bipolar transistor are likewise limited by the SiGe:C layer. For example, subsequent annealing processes may exposes the bipolar transistor to temperatures up to 1080 degrees Celsius (° C.). However, carbon subsitutionally combined in the SiGe lattice as in this embodiment can limit diffusion of, for example, boron and maintain the width of a boron doped base region of 10 nm width to a width of 14 nm after annealing.

In one embodiment, after a 20 nm SiGe or SiGe:C layer 707 is formed over the single crystal silicon layer 703, the germanium based gas flow is slowly ramped down from its peak flow of 140 sccm (FIG. 1, block 7). In this embodiment, during the period when the germanium-based gas is ramped down, manifold flow control valve 115 for diborane ($B_2H_6$) (See FIG. 2) is saturated with diborane gas (FIG. 1, block 8). The concentration of diborane in source 114 is 1 percent with the remainder a carrier gas such as $H_2$. In this embodiment, manifold flow control valve 115 associated with the source 114 for diborane directs the diborane gas flow directly to reactor exhaust 104. A steady state of diborane gas flow is established in associated manifold flow control valve 115. In another embodiment, the diborane flow is directed to the exhaust 104 by manifold flow control valve 115 before the germanium flow ramp down begins.

Figure 10:
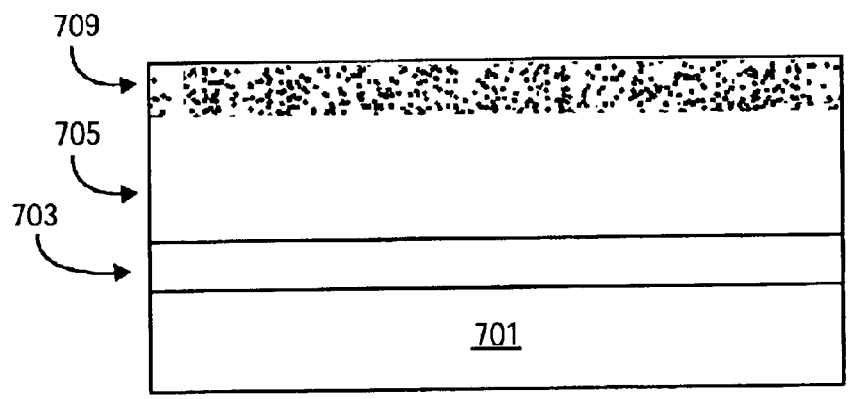
FIG. 10 depicts the substrate of FIG. 8 with a boron doped region of silicon germanium formed thereon.

In one embodiment, when the germanium-based gas flow grades down to 75 sccm, the diborane will be in a steady state and introduced into reaction chamber 101 by manifold flow control valve 115. In this embodiment, a diborane gas flow of 20 sccm is used. The diborane gas flow introduction is "flashed" into the reaction chamber 101. A representative flash of diborane gas is on the order of a few seconds, e.g., three seconds (block 9). In this embodiment, during the diborane flash period, the germanium gas flow is reduced from 75 sccm to 70 sccm. A 10 nm doped base region of the transistor is thereby formed (FIG. 1, block 10). A 20 sccm flow of diborane gas forms a 8E19 carriers per cubic centimeter peak concentration doped base region. In other embodiments, the diborane gas flow rate is varied up to 100 sccm. At 100 sccm, a peak concentration of 2E20 carriers per cubic centimeter is achieved. FIG. 10 shows the boron doped region 709 formed over emitter region 705 and substrate 703.

The variables of the diborane gas flow flash including length of the flash period, rate of gas flow and concentration of source gas can be varied to achieve predictable results. The diborane gas flash can be for a lengthened period of time resulting in a wider doped base region including flash periods up to 20 seconds in length. Diborane flashes with duration of less than three seconds tend not to produce base regions with sufficient boron concentration levels according to current processing limitations.

Figure 11:
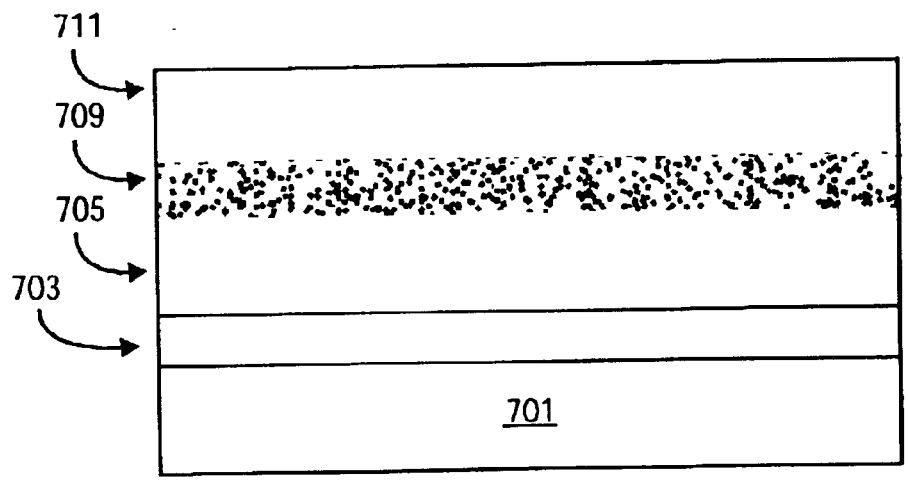
FIG. 11 depicts the substrate of FIG. 10 with an additional layer of silicon germanium formed over the boron doped region.

In one embodiment, a SiGe layer continues to form after the diborane flash is completed and the boron doped region has been formed. The $SiH_4$ and $GeH_4$ continues to flow into the reactor chamber 101. FIG. 11 shows a substrate with a SiGe layer 711 formed over the boron-doped region 709. The flow of $SiH_4$ and $GeH_4$ is halted to complete the layer 711 (block 11). Alternatively, a $CH_3SiH_3$ flow is stopped with the $SiH_4$ and $GeH_4$ where $CH_3SiH_3$ is used to form SiGe:C. In one embodiment, the flow of $SiH_4$ continues after the $GeH_4$ and $CH_3SiH_3$ flows have halted. A 20 nm silicon cap is formed over the SiGe:C structure (FIG. 1, block 12). The SiH$_4$ flow is subsequently stopped once the cap is completed (FIG. 1, block 13).

Figure 3:
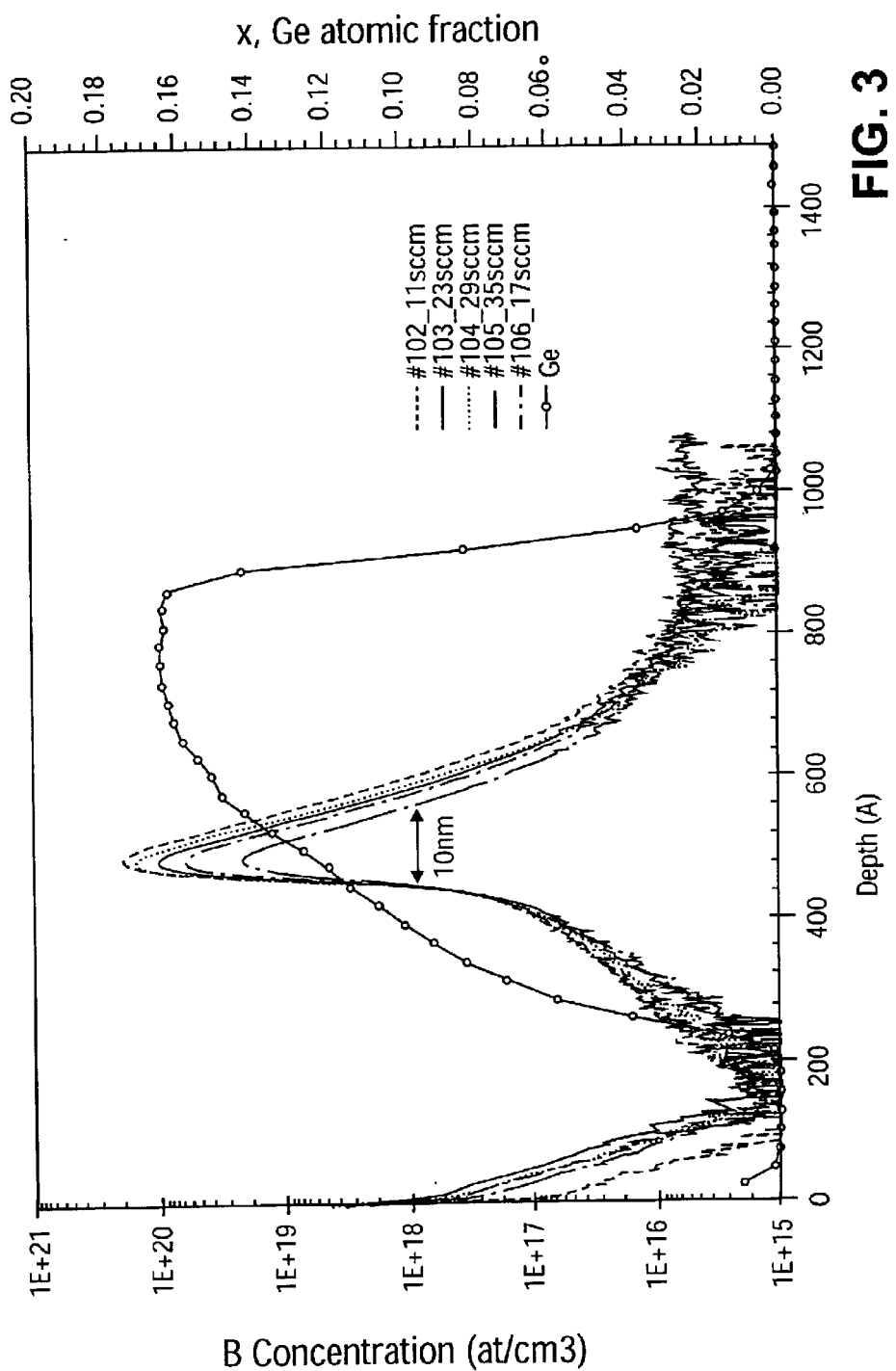
FIG. 3 is a Secondary Ion Mass Spectrometry (SIMS) profile of ultra narrow boron doped SiGe:C base of an HBT, including boron and germanium concentration for various flow rates of diborane gas.

FIG. 3 is a Secondary Ion Mass Spectrometry (SIMS) profile of one embodiment. The profile charts the concentration of boron and germanium over the depth of the transistor being formed. Such as the transistor illustrated in FIGS. 7–12. The profile charts germanium concentration and diborane concentration for flow rates of diborane at 11, 17, 23, 29 and 35 sccm. The graph illustrates that increased boron concentration levels can be achieved while maintaining a very narrow base width. The graph illustrates the ramping up of germanium concentration. Then during the diborane flash (e.g., 400 Å to 600 Å) increased boron concentration levels are achieved at increased diborane flow rates while maintaining the 10 nm width of the base region.

Figure 4:
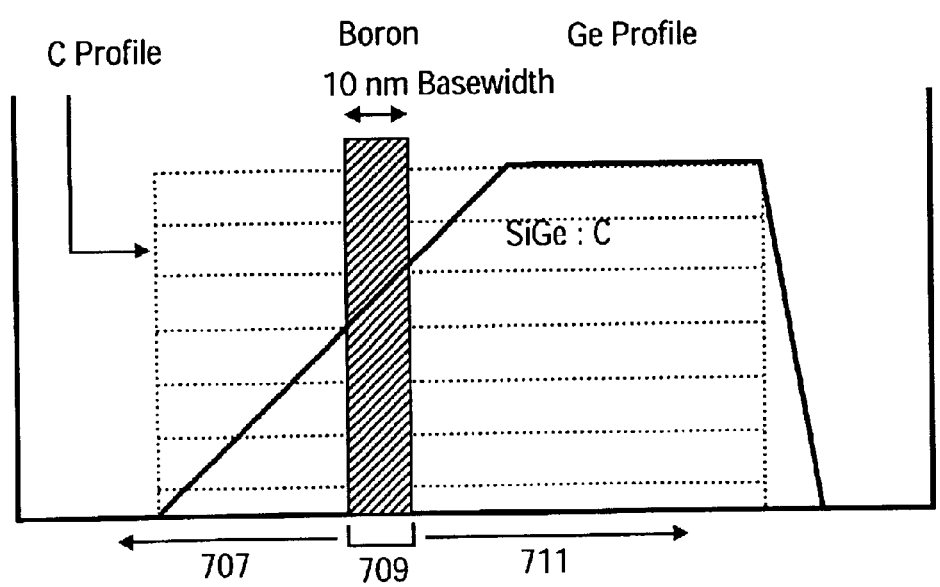
FIG. 4 is a schematic depicting the placement of in situ doped boron and carbon in the Si/SiGe/Si base stack.

FIG. 4 is a graph of one embodiment where carbon is substitutionally combined with the silicon germanium to minimize boron out diffusion. The graph illustrates carbon germanium and boron depositions over time. The hard black line slopping up depicts the rising germanium levels combining with the carbon and silicon (not shown) to create the emitter region 707. Diborane is flashed into the chamber to form the 10 nm the boron doped base 709. Germanium continues to deposit to form collector region 711.

Figure 5:
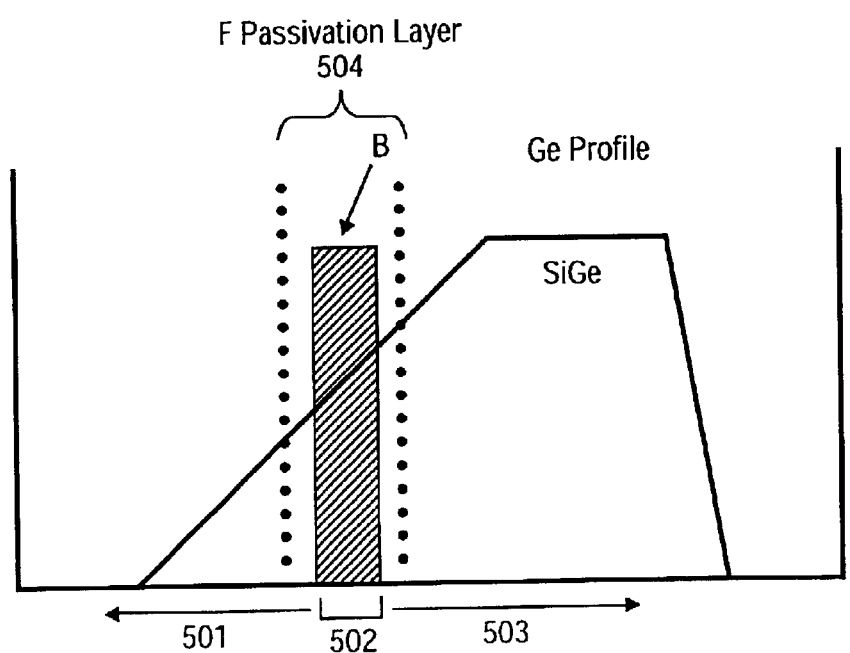
FIG. 5 is a schematic of an embodiment of an HBT with a fluorine passivation layer.

In another embodiment, a fluorine passivation layer is used to minimize out-diffusion of boron in the base layer during processing subsequent to the initial deposition of the boron to form the base. FIG. 5 is a SIMS profile of this embodiment with emitter region 501, base region 502, and collector region 503. The fluorine passivation layer 504 encompasses the base region 502.

Referring to FIG. 2, in one embodiment, the fluorine passivation layer is formed by introducing a fluorine gas such as fluorine (F$_2$) into the chamber 101. In another embodiment, the fluorine passivation layer is formed by cracking SiF$_6$ using plasma techniques, non-plasma techniques or external fluorine passivation.

Figure 12:
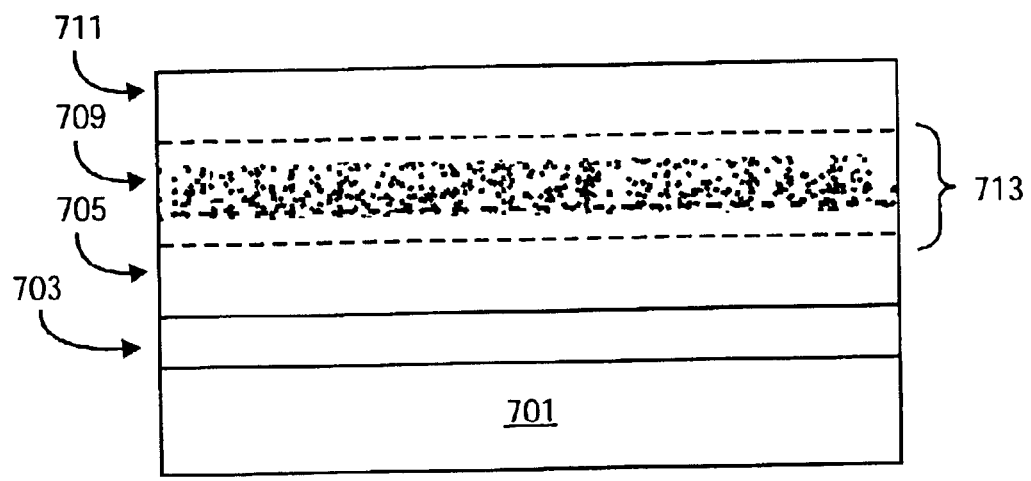
FIG. 12 depicts a substrate where a fluorine passivation layer has been formed to encompass a boron doped region.

The fluorine gas may be introduced before the diborane flash and ending the F$_2$ flow into the chamber after the diborane flow is stopped. In another embodiment, the fluorine flow is started after the diborane flow is started but before it is complete. In another embodiment, the fluorine flow is started before the diborane flow but stopped before the diborane flow into the chamber is stopped. This results in a fluorine passivation layer that does not entirely encompass the boron doped region thereby only limiting out diffusion of boron on one side of the base region. It is believed that the fluorine minimizes boron out diffusion by combining with the silicon germanium substrate at substitutional sites in the silicon germanium lattice. FIG. 12 illustrates a substrate where a fluorine passivation layer 713 has been formed to encompass the boron doped region 709. In this embodiment, the fluorine passivation layer suppress out diffusion of boron into SiGe layers 705 and 711.

Figure 6:
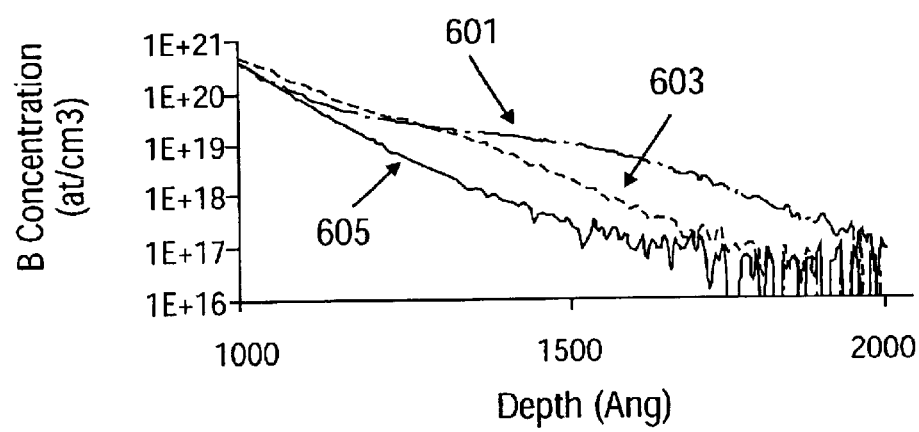
FIG. 6 is a SIMS profile demonstrating the effect of a fluorine passivation layer on boron diffusion.

FIG. 6 is a graph illustrating the effect of fluorine passivation layer on boron out diffusion after annealing at 1080° C. The graph illustrates a range of thickness for the boron doped region over concentrations from 1E+16 to 1E+21 before annealing (line 605). The graph also illustrates the range of thickness after annealing at 1080° C. without fluorine passivation layer (line 601) and with a passivation layer (line 603). The graph thereby demonstrates the effect of fluorine to limit out diffusion of boron during annealing. For example, a boron doped region with a width as deposited of 1300 Å may expand to a width of approximately 1750 Å if no fluorine passivation layer is present. However, if a fluorine passivation layer is present, the expansion of the boron doped region is limited to 1550 Å.

In one embodiment, using a CVD chamber, all depositions are carried out with a reactor chamber temperature of 600° C. The rate of deposition is generally affected by temperature. The temperature also affects the substitution of carbon into the SiGe lattice. If carbon is introduced at temperatures above approximately 600° C., the carbon tends not be introduced substitutionally to the SiGe lattice. At 600° C. carbon concentration will be approximately 0.3 percent in the SiGe:C layer. In other embodiments, deposition temperature and carbon concentration in the SiGe:C layer can vary.

In one embodiment, using the CVD chamber, all depositions are carried out at a chamber pressure of 80 torr. In other embodiments chamber pressure can vary from a few mtorr to atmospheric pressure.

In another embodiment, a carrier gas is introduced into the reaction chamber throughout the depositions. In one embodiment this carrier gas is hydrogen (H$_2$). H$_2$ is introduced into the reaction chamber as a carrier gas at 20 standard liters per minute (slpm) through associated manifold flow control 113 from hydrogen source 112. In other embodiments, H$_2$ flow can vary from 5 slpm to 50 slpm.

Having disclosed exemplary embodiments, modifications and variations may be made to the disclosed embodiments while remaining within the spirit and scope of the invention as defined by the appended claims.

What is claimed is:

1. A method comprising:
    establishing a steady state of a carrier precursor flow in a flow control unit prior to release introducing the carrier precursor flow into the chamber to form a region doped with a carrier in a base portion of a bipolar transistor on a substrate.
2. The method of claim 1 wherein the carrier precursor includes a boron material.
3. The method of claim 2 wherein boron in the doped region has a concentration greater than 8E19 carriers/cm$^3$.
4. The method of claim 1 further comprising introducing a suppressant having a property that when present in the bipolar transistor, acts to suppress a diffusion of the carrier.
5. The method of claim 4 wherein the suppressant is fluorine.
6. The method of claim 1 further comprising:
    depositing silicon germanium on the substrate within the chamber to form a feature of the bipolar transistor.
7. The method of claim 6 wherein depositing silicon germanium includes introducing a germanium source gas into the chamber and after a time period ramping down the introduction of the germanium source gas over a ramp down period; and
    wherein the carrier precursor is introduced into the chamber during the ramp down period.
8. The method of claim 7 wherein the germanium gas flow ramps down from 140 sccm to 45 sccm.
9. The method of claim 6 further comprising:
    establishing a first chamber pressure in the chamber during the germanium source gas introduction; and
    maintaining a second chamber pressure during the carrier precursor introduction.
10. The method of claim 9 wherein the second chamber pressure is on the order of 80 torr.
11. The method of claim 1 further comprising:
    maintaining a chamber temperature on the order of 600° C. during the carrier precursor introduction.

12. The method of claim 1 wherein the carrier precursor flow is introduced into the chamber for approximately three seconds.

13. The method of claim 1 wherein the carrier precursor flow into the chamber is 20 sccm.

14. A method comprising:
saturating a flow control unit with a carrier precursor while directing the carrier precursor away from a chamber to a chamber exhaust; and
altering the flow control to introduce the carrier precursor into the chamber.

15. The method of claim 14 wherein introducing the carrier precursor into the chamber forms a doped region in a base portion of a bipolar transistor.

16. The method of claim 15 wherein the base portion width is 20 nanometers or less.

17. A method comprising:
doping a portion of a feature on a substrate with an amount of a carrier precursor, the doping at a concentration suitable to transform the conductivity of the portion of the feature to function as a base of a bipolar transistor, wherein the doping is done for a time period such that the doping is confined to a feature width of 20 nanometers or less; and
introducing a suppressant into a portion of the substrate, the suppressant having a property that when present in the substrate, acts to suppress a diffusion of the carrier,
wherein the suppressant is fluorine that combines substantially with the substrate.

18. A method comprising:
doping a portion of a feature on a substrate with an amount of a carrier precursor, the doping at a concentration suitable to transform the conductivity of the portion of the feature to function as a base of a bipolar transistor, wherein the doping is done for a time period such that the doping is confined to a feature width of 20 nanometers or less; and
introducing a suppressant into a portion of the substrate, the suppressant having a property that when present in the substrate, acts to suppress a diffusion of the carrier,
wherein the suppressant is introduced in situ into a chamber using a fluorine based gas.

19. A method comprising:
doping a portion of a feature on a substrate with an amount of a carrier precursor, the doping at a concentration suitable to transform the conductivity of the portion of the feature to function as a base of a bipolar transistor, wherein the doping is done for a time period such that the doping is confined to a feature width of 20 nanometers or less; and
introducing a suppressant into a portion of the substrate, the suppressant having a property that when present in the substrate, acts to suppress a diffusion of the carrier,
wherein the suppressant is introduced by cracking fluorine based gas using plasma or non-plasma techniques.

* * * * *

UNITED STATES PATENT AND TRADEMARK OFFICE
CERTIFICATE OF CORRECTION

PATENT NO. : 6,927,140 B2 Page 1 of 1
DATED : August 9, 2005
INVENTOR(S) : Soman et al.

It is certified that error appears in the above-identified patent and that said Letters Patent is hereby corrected as shown below:

<u>Column 6,</u>
Line 33, after "release" insert -- into a chamber; --.

Signed and Sealed this

Eleventh Day of October, 2005

JON W. DUDAS
*Director of the United States Patent and Trademark Office*